(12) United States Patent
Hoffmeyer et al.

(10) Patent No.: US 12,457,693 B2
(45) Date of Patent: Oct. 28, 2025

(54) APPLYING A SOLDERABLE SURFACE TO CONDUCTIVE INK

(71) Applicant: INTERNATIONAL BUSINESS MACHINES CORPORATION, Armonk, NY (US)

(72) Inventors: Mark K. Hoffmeyer, Rochester, MN (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/494,187

(22) Filed: Oct. 25, 2023

(65) Prior Publication Data

US 2024/0057266 A1 Feb. 15, 2024

Related U.S. Application Data

(62) Division of application No. 16/450,147, filed on Jun. 24, 2019, now Pat. No. 11,805,603.

(51) Int. Cl.
*H05K 3/34* (2006.01)
*H05K 3/24* (2006.01)

(52) U.S. Cl.
CPC ........... *H05K 3/3485* (2020.08); *H05K 3/245* (2013.01); *H05K 2201/035* (2013.01); *H05K 2203/043* (2013.01)

(58) Field of Classification Search
CPC . H05K 2201/035; H05K 3/245; H05K 3/3485
See application file for complete search history.

(56) References Cited

U.S. PATENT DOCUMENTS

| | | | |
|---|---|---|---|
| 4,327,124 A | | 4/1982 | DesMarais, Jr. |
| 4,808,434 A | * | 2/1989 | Bennett ............... H05K 3/4664 427/521 |
| 5,045,127 A | * | 9/1991 | Dershem ............... B23K 35/36 148/22 |
| 5,118,458 A | | 6/1992 | Nishihara et al. |
| 5,133,495 A | | 7/1992 | Angulas et al. |
| 5,261,155 A | | 11/1993 | Angulas et al. |
| 7,617,592 B2 | | 11/2009 | Rayl et al. |
| 8,063,315 B2 | | 11/2011 | Das et al. |
| 2004/0232386 A1 | * | 11/2004 | Yorita ............... C25D 1/10 257/E21.175 |

(Continued)

FOREIGN PATENT DOCUMENTS

| | | |
|---|---|---|
| CN | 1184266 C | 1/2005 |
| CN | 102117890 A | 7/2011 |
| JP | 2003217967 A | 7/2003 |

OTHER PUBLICATIONS

Appendix P; List of IBM Patent or Applications Treated as Related, Oct. 25, 2023, 2 pages.

(Continued)

*Primary Examiner* — Livius R. Cazan
(74) *Attorney, Agent, or Firm* — Onyx IP Group

(57) ABSTRACT

Applying a solderable surface to conductive ink may include partially curing a conductive ink trace; applying, to the partially cured conductive ink trace, a conductive paste comprising conductive particles; and curing the partially cured conductive ink trace and the conductive paste.

9 Claims, 7 Drawing Sheets

(56) References Cited

U.S. PATENT DOCUMENTS

| | | |
|---|---|---|
| 2008/0086876 A1 | 4/2008 | Douglas |
| 2011/0122596 A1 | 5/2011 | Miyazaki et al. |
| 2015/0313008 A1* | 10/2015 | Spath .................... G06F 3/047 |
| | | 345/174 |
| 2016/0031030 A1 | 2/2016 | Bergström et al. |
| 2020/0404795 A1 | 12/2020 | Hoffmeyer et al. |

OTHER PUBLICATIONS

U.S. Appl. No. 16/295,133, to Prabjit Singh, entitled, Bondable Conductive Ink Contact Pad(s), assigned to International Business Machines Corporation, 39 pages, filed Mar. 7, 2019.
No. Author. "Conductive & Resistive Inks", retrieved from web https://web.archive.org/web/20120302140218/http://www.methode.com/sensors-and-switches/conductive-and-resistive-inks.html, dated May 9, 2025, 3 pages.

* cited by examiner

APPLYING A SOLDERABLE SURFACE TO CONDUCTIVE INK

BACKGROUND

Field of the Invention

The field of the invention is circuit assembly, or, more specifically, methods, apparatus, and products for applying a solderable surface to conductive ink.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Applying a solderable surface to conductive ink may include partially curing a conductive ink trace; applying, to the partially cured conductive ink trace, a conductive paste comprising conductive particles; and curing the partially cured conductive ink trace and the conductive paste.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Conductive inks, dyes, and coatings (generally referred to herein as conductive inks) are available for producing printed or flexible electronics, and can be produced, for instance, by adding conductive material (e.g., in powder form) to a polymer base with a solvent component, and mixing the material, base and solvent to produce a uniform, uncured dispersion. The dispersion can be used to print or apply circuit elements onto a non-conductive substrate, such as a flexible polymer film, cloth, or other material. The dispersion can then be cured, with the result being a conductive circuit formed on the flexible substrate. Such circuits can have drawbacks, including difficulty in creating a reliable solder connection to conductive ink.

Figure 1A:
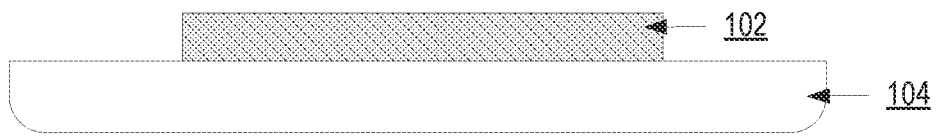
FIG. 1A is an example view of a conductive ink trace for applying a solderable surface to conductive ink.

Exemplary methods, apparatus, and products for applying a solderable surface to conductive ink in accordance with the present invention are described with reference to the accompanying drawings, beginning with FIG. 1A. FIG. 1A sets forth an example view of conductive ink 102 applied to a non-conductive substrate 104, thereby creating a conductive ink 102 trace on the substrate 104. The conductive ink 102 comprise a conductive material added to a polymer or epoxy to form a uniform dispersion. The conductive ink 102 may be applied as a wet layer to the substrate 104. The conductive ink 102 may then be cured. Curing the conductive ink 102 removes solvent from the conductive ink 102. As solvent is removed, the conductive ink 102 approaches a dry consistency. For example, the conductive ink 102 may be cured using air drying (e.g., air drying at room temperature) which may be facilitated by fans or air currents. The conductive ink 102 may also be cured using applications of heat, ultraviolet (UV) rays, or chemical curing accelerants. The cured conductive ink 102 may suffer from poor surface solderability and component solder joint reliability because a thin skin of polymer coating is present on the conductive particles in the conductive ink 102. To facilitate soldering, this skin may be broken with heat or abrasion to expose fresh conductive particles and promote liquid solder wetting. However, such solder joints may be discontinuous given the presence of polymeric material at the interface. Moreover, excess heat or abrasion used to drive solder wetting can damage other circuitry and affect the reliability of other interconnects.

Figure 1B:
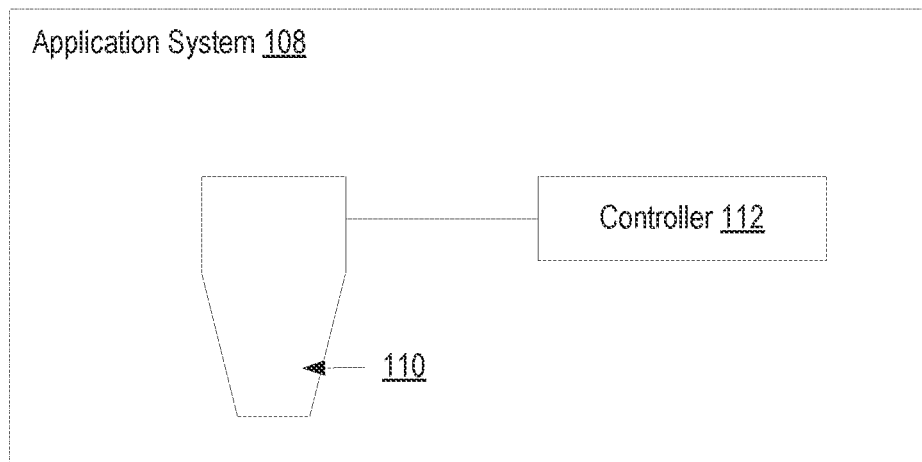
FIG. 1B is an example view of a conductive ink trace for applying a solderable surface to conductive ink.
Figure 1B:
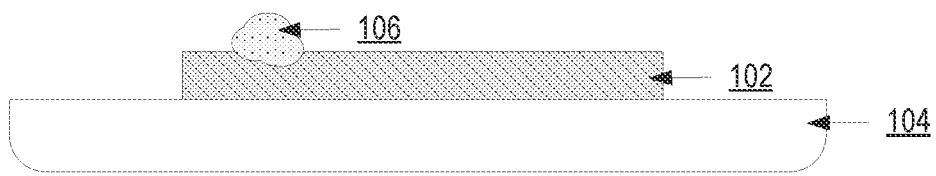

To address these concerns, a conductive paste 106 may be applied to the conductive ink 102 as shown in FIG. 1B. FIG. 1B sets forth another example view of conductive ink 102 applied to a non-conductive substrate 104. A conductive paste 106 has been applied to the conductive ink 102 trace after partially curing the conductive ink 102 trace. Partially curing the conductive ink 102 trace may comprise curing the conductive ink 102 until the conductive ink 102 reaches a partially dry or "tacky" consistency. For example, assuming that the conductive ink 102 may be cured by applying heat for 60 minutes, the conductive ink 102 may be considered partially cured after a time period less than 60 minutes (e.g., 30 minutes).

The conductive paste 106 comprises conductive particles. The conductive particles may comprise particles of silver, gold, copper, tin, or other conductive metals. For example, the conductive particles may comprise particles of pure conductive metals, or alloys of conductive metals. The conductive particles may also comprise particles plated or coated with surface treatments of conductive metals or their alloys. For example, the conductive particles may comprise plastic or another non-conductive material coated or plated with a surface treatment of a conductive metal or alloy. The conductive particles may be platelet particles (e.g., plate or disc shaped), elongate particles (e.g., rod or needle shaped), other shapes, or combinations thereof. Preferably, platelet or elongate particles may be used to enhance the roughness of the paste and provide a surface more easily bonded to using conductors (e.g., solder). The conductive paste 106 also comprises a solvent such that the conductive paste 106 may be cured to form a dry consistency. Preferably, the solvent in the conductive paste 106 may be the same solvent as that which is found in the conductive ink 102. This improves bonding and connectivity between the conductive paste 106 and conductive ink 102 after final curing, avoiding the slump of conductive ink 102 caused by an introduction of excess solvent. The solvent in the conductive paste 106 may also be different from the solvent in the conductive ink 102.

The conductive paste 106 may be applied using an application system 108. The application system 108 may comprise an applicator 110 that ejects, extrudes, or otherwise deposits the conductive paste 106 on the partially cured conductive ink 102 trace. For example, the application system 108 may apply the conductive paste 106 using 3D printing techniques, screen printing techniques, stenciling techniques, or other techniques as can be appreciated. The applicator 110 may be controlled using a controller 112 configured to control the amount and location of conductive paste 106 applied.

After applying the conductive paste 106 to the partially cured conductive ink 102 trace, the partially cured conductive ink 102 trace and the conductive paste 106 may be cured. For example, heat, ultraviolet (UV) rays, air currents, chemical agents, or combinations thereof may be applied to the partially cured conductive ink 102 trace and the conductive paste 106 until the conductive ink 102 and conductive paste 106 achieve a dry consistency. After curing the partially cured conductive ink 102 trace and the conductive paste 106, the cured conductive ink 102 trace and conductive paste 106 may be washed (e.g., with water or other agents) to remove any excess or loose conductive particles from the cured conductive ink 102 trace and conductive paste 106. The cured conductive paste 106 may then provide a suitable surface for bonding a conductor (e.g., solder).

Applying a solderable surface to conductive ink in accordance with the present invention is generally implemented with computers, that is, with automated computing machinery. For further explanation, therefore, FIG. 2 sets forth a block diagram of automated computing machinery comprising an exemplary controller 112 configured applying a solderable surface to conductive ink according to embodiments of the present invention. The controller 112 of FIG. 2 includes at least one computer processor 202 or 'CPU' as well as random access memory 204 ('RAM') which is connected through a high speed memory bus 206 and bus adapter 208 to processor 202 and to other components of the controller 112.

Figure 2:
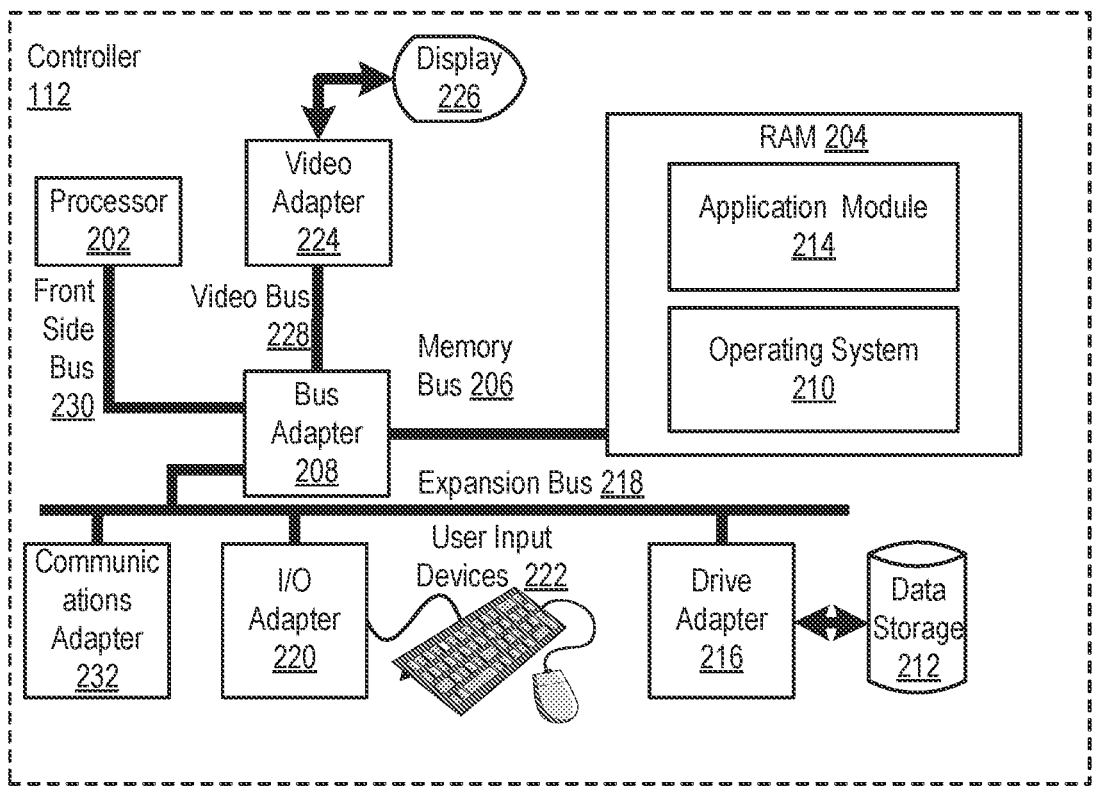
FIG. 2 is a block diagram of an example computing device for applying a solderable surface to conductive ink.

Stored in RAM 204 is an operating system 210. Operating systems useful in computers configured for applying a solderable surface to conductive ink according to embodiments of the present invention include UNIX™ Linux™, Microsoft Windows™, AIXT™, BM's i OS™, and others as will occur to those of skill in the art. The operating system 208 in the example of FIG. 2 is shown in RAM 204, but many components of such software typically are stored in non-volatile memory also, such as, for example, on data storage 212, such as a disk drive. Also stored in RAM is the application module 214 a module for applying a solderable surface to conductive ink according to embodiments of the present invention.

The controller 112 of FIG. 2 includes disk drive adapter 216 coupled through expansion bus 218 and bus adapter 208 to processor 202 and other components of the controller 112. Disk drive adapter 216 connects non-volatile data storage to the controller 112 in the form of data storage 212. Disk drive adapters useful in computers configured for applying a solderable surface to conductive ink according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example controller 112 of FIG. 2 includes one or more input/output ('I/O') adapters 220. I/O adapters implement user-oriented input/output through, for example, software drivers and computer hardware for controlling output to display devices such as computer display screens, as well as user input from user input devices 222 such as keyboards and mice. The example controller 112 of FIG. 2 includes a video adapter 224, which is an example of an I/O adapter specially designed for graphic output to a display device 226 such as a display screen or computer monitor. Video adapter 224 is connected to processor 202 through a high speed video bus 228, bus adapter 208, and the front side bus 230, which is also a high speed bus.

The exemplary controller 112 of FIG. 2 includes a communications adapter 232 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for applying a solderable surface to conductive ink according to embodiments of the present invention include modems for wired dial-up communications, Ethernet (IEEE 802.3) adapters for wired data communications, and 802.11 adapters for wireless data communications.

Figure 3:
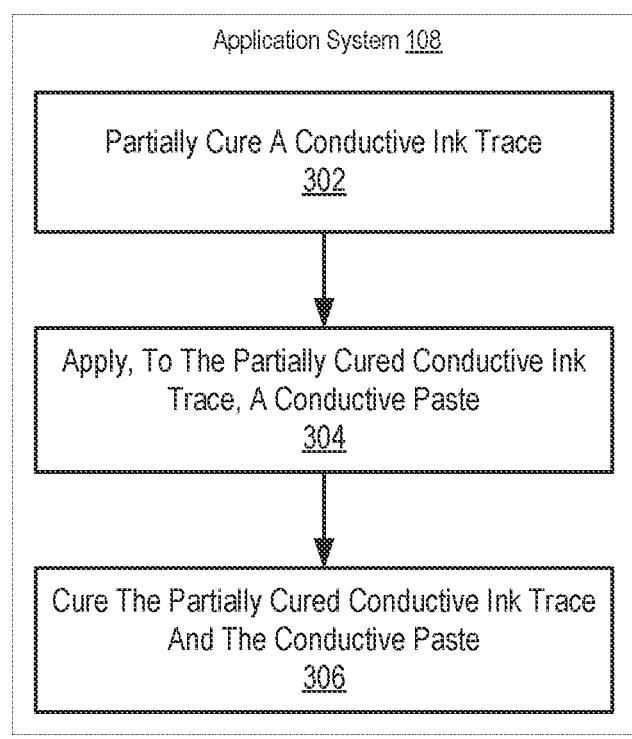
FIG. 3 is a flowchart of an example method for applying a solderable surface to conductive ink.

For further explanation, FIG. 3 sets forth a flow chart illustrating an exemplary method for applying a solderable surface to conductive ink according to embodiments of the present invention that includes partially curing 302 a conductive ink 102 trace (e.g., by an application system 108). Partially curing the conductive ink 102 trace may comprise curing the conductive ink 102 until the conductive ink 102 reaches a partially dry or "tacky" consistency. Partially curing the conductive ink 102 trace may comprise applying heat, air currents, chemical agents, ultraviolet (UV) rays, or combinations thereof. For example, assuming that the conductive ink 102 may be cured by applying heat for 60 minutes, the conductive ink 102 may be considered partially cured after a time period less than 60 minutes (e.g., 30 minutes).

The method of FIG. 3 further comprises applying 304, to the partially cured conductive ink 102 trace, a conductive paste 106. The conductive paste 106 comprises conductive particles. The conductive particles may comprise particles of silver, gold, copper, tin, or other conductive metals. The conductive particles may comprise conductive noble metals (e.g., silver, gold) for enhanced resistance to oxidation and/or corrosion. For example, the conductive particles may comprise particles of pure conductive metals, or alloys of conductive metals. The conductive particles may also comprise particles plated or coated with surface treatments of conductive metals or their alloys. The conductive particles may be platelet particles (e.g., plate or disc shaped), elongate particles (e.g., rod or needle shaped), other shapes, or combinations thereof. Preferably, platelet or elongate particles may be used to enhance the roughness of the paste and provide a surface more easily bonded to using conductors (e.g., solder). The conductive paste 106 also comprises a solvent such that the conductive paste 106 may be cured to form a dry consistency. Preferably, the solvent in the conductive paste 106 may be the same solvent as that which is found in the conductive ink 102. The solvent in the conductive paste 106 may also be different from the solvent in the conductive ink 102.

The method of FIG. 3 further comprises curing 306 the partially cured conductive ink 102 trace and the conductive paste 106. For example, heat, air currents, chemical agents, or combinations thereof may be applied to the partially cured conductive ink 102 trace and the conductive paste 106 until the conductive ink 102 and conductive paste 106 achieve a dry consistency. Thus, the conductive paste 106 has bonded with and penetrated the conductive ink 102 trace so as to provide a surface to which conductors can be bonded, thereby creating a conductive path to the conductive ink 102 trace.

Figure 4:
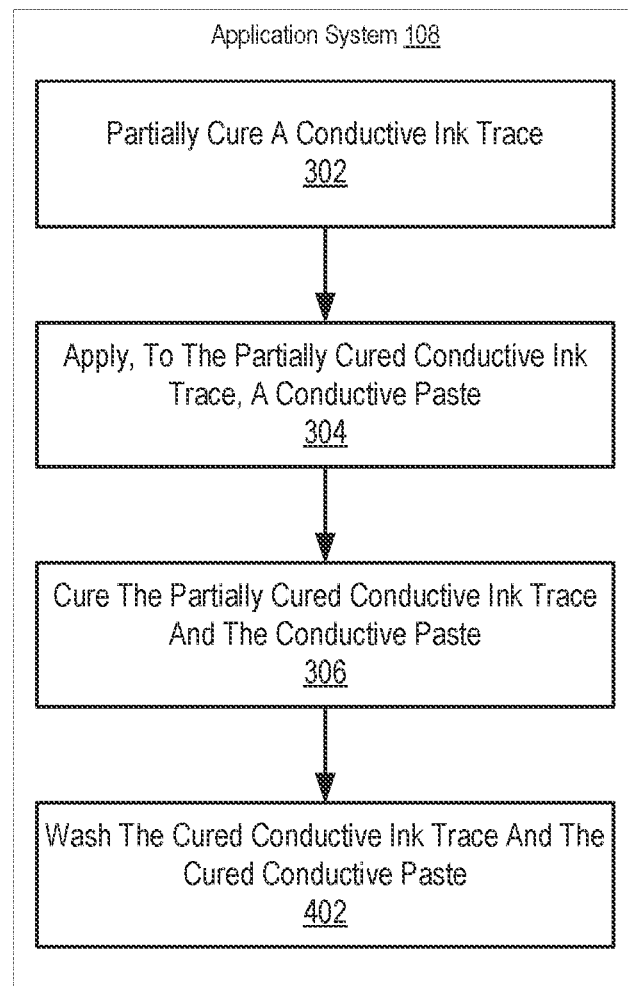
FIG. 4 is a flowchart of an example method for applying a solderable surface to conductive ink.

For further explanation, FIG. 4 sets forth a flow chart illustrating a further exemplary method for applying a solderable surface to conductive ink that includes partially curing 302 a conductive ink 102 trace; applying 304, to the partially cured conductive ink 102 trace, a conductive paste 106; and curing 306 the partially cured conductive ink trace and the conductive paste 106.

The method of FIG. 4 differs from FIG. 3 in that the method of FIG. 4 includes washing 402 the cured conductive ink 102 trace and the cured conductive paste 106. The cured conductive ink 102 trace and conductive paste 106 may be washed (e.g., with water or other agents) to remove any excess or loose conductive particles from the cured conductive ink 102 trace and conductive paste 106. This reduces the probability of circuit impediment or damage due to loose conductive particles.

Figure 5:
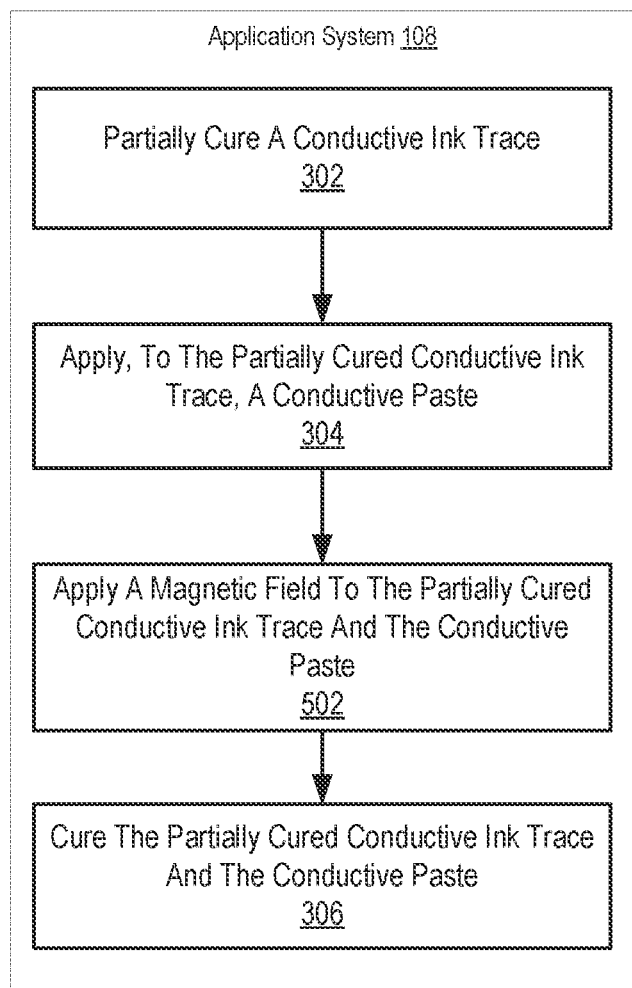
FIG. 5 is a flowchart of an example method for applying a solderable surface to conductive ink.

For further explanation, FIG. 5 sets forth a flow chart illustrating a further exemplary method for applying a solderable surface to conductive ink that includes partially curing 302 a conductive ink 102 trace; applying 304, to the partially cured conductive ink 102 trace, a conductive paste 106; and curing 306 the partially cured conductive ink trace and the conductive paste 106.

The method of FIG. 5 differs from FIG. 3 in that the method of FIG. 5 includes applying 502 a magnetic field to the conductive paste 106. The magnetic field may be applied at an angle relative to a substrate 102 to which the conductive ink 102 trace is applied (e.g., 45 degrees). Applying the magnetic field serves to align the conductive particles in the conductive paste 106, enhancing conductivity and improving penetration of the conductive particles of the conductive paste 106 into the partially cured conductive ink 102 trace. Accordingly, the conductive particles of the conductive paste 106 may comprise a ferromagnetic metal. For example, the conductive particles of the conductive paste 106 may comprise iron, nickel, or cobalt particles coated or plated in a conductive metal (e.g., silver, gold, copper, tin, or alloys thereof). The magnetic field is applied prior to curing 306 the partially cured conductive ink 102 trace and the conductive paste 106 to allow the conductive particles in the conductive paste 106 to move and align with minimal resistance.

Figure 6:
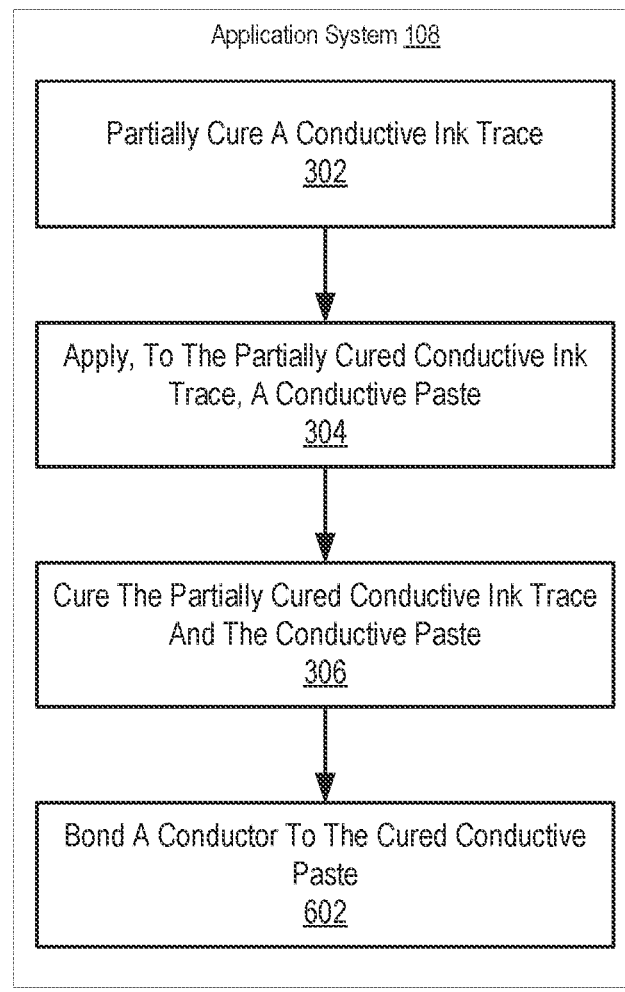
FIG. 6 is a flowchart of an example method for applying a solderable surface to conductive ink.

For further explanation, FIG. 6 sets forth a flow chart illustrating a further exemplary method for applying a solderable surface to conductive ink that includes partially curing 302 a conductive ink 102 trace; applying 304, to the partially cured conductive ink 102 trace, a conductive paste 106; and curing 306 the partially cured conductive ink trace and the conductive paste 106.

The method of FIG. 6 differs from FIG. 3 in that the method of FIG. 6 includes bonding 602 a conductor to the cured conductive paste 106. For example, solder or another liquid conductor may be applied to the cured conductive paste 106 to connect a component to the cured conductive paste 106, thereby providing a conductive path between a component and the cured conductive ink 102 trace.

Figure 7:
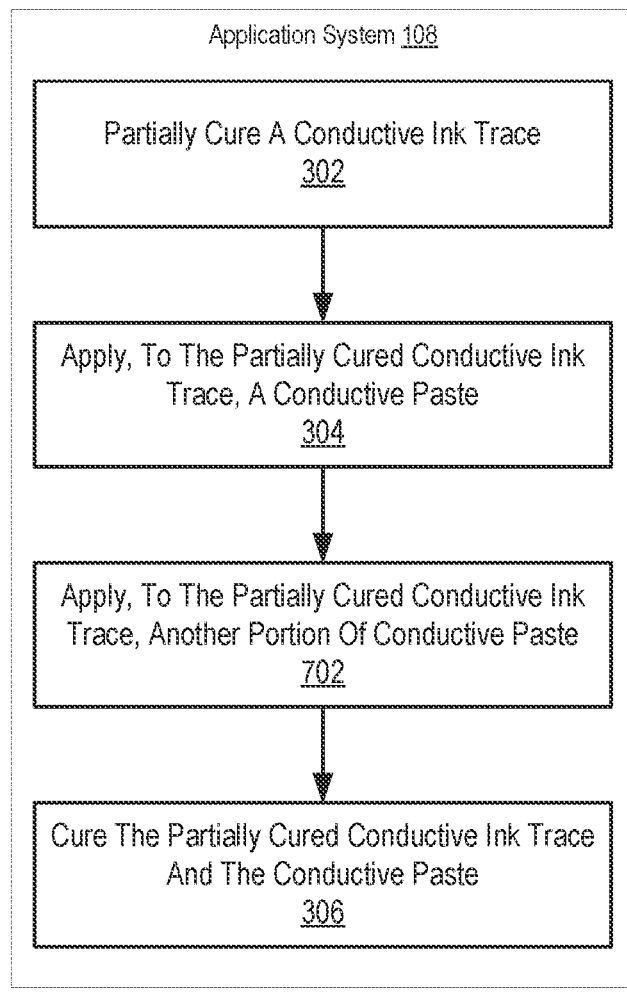
FIG. 7 is a flowchart of an example method for applying a solderable surface to conductive ink.

For further explanation, FIG. 7 sets forth a flow chart illustrating a further exemplary method for applying a solderable surface to conductive ink that includes partially curing 302 a conductive ink 102 trace; applying 304, to the partially cured conductive ink 102 trace, a conductive paste 106; and curing 306 the partially cured conductive ink trace and the conductive paste 106.

The method of FIG. 7 differs from FIG. 3 in that the method of FIG. 6 includes applying (702), to the partially cured conductive ink trace, another portion of conductive paste. The other portion of conductive paste may comprise conductive particles of a same material or a different material as the conductive paste otherwise applied (304). The other portion of the conductive paste may be used to provide another site for improved solderability. The other portion of conductive paste may be used to facilitate application or adhesion of conductive pads or other components. The other portion of conductive paste may also be used to provide improved corrosion resistance or signal integrity of the trace. For example, the other portion of conductive paste may be applied along a length of the trace to provide corrosion resistance for the underlying trace. As another example, the other portion of conductive paste may comprise conductive particles with a greater conductivity than the conductive ink trace. The other portion of conductive paste may then be applied along a length of the trace to provide improved signal integrity due to the greater conductivity of the other portion of the conductive paste.

In view of the explanations set forth above, readers will recognize that the benefits of applying a solderable surface to conductive ink according to embodiments of the present invention include:

Solder or other liquid conductors can be bonded to conductive paste to create a conductive link to the conductive ink trace.

Components may be linked to the conductive ink trace without applying heat or abrasion to the conductive ink trace, which are potentially harmful to surrounding components and circuits.

Exemplary embodiments of the present invention are described largely in the context of a fully functional computer system for applying a solderable surface to conductive ink. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for applying a solderable surface to conductive ink, comprising:
   partially curing a conductive ink trace;
   applying, to the partially cured conductive ink trace, a conductive paste, wherein the conductive paste is uncured and includes a solvent and conductive particles;
   applying, prior to curing the partially cured conductive ink trace and the conductive paste, a magnetic field to the conductive paste to align the conductive particles in the conductive paste; and
   curing the partially cured conductive ink trace and the conductive paste.

2. The method of claim 1, further comprising washing the cured conductive ink trace and the cured conductive paste.

3. The method of claim 1, wherein the conductive particles comprise a ferromagnetic metal core coated in a conductive metal.

4. The method of claim 1, wherein the conductive ink trace and the conductive paste comprise a same solvent.

5. The method of claim 1, wherein the conductive particles comprise at least one of platelet particles or elongate particles.

6. The method of claim 1, further comprising bonding a conductor to the cured conductive paste.

7. The method of claim 1, wherein the conductive paste comprises a first portion of conductive paste, and the method further comprises applying a second portion of conductive paste to the conductive ink trace.

8. The method of claim 7, wherein the first portion of conductive paste and the second portion of conductive paste comprise conductive particles of different materials.

9. The method of claim 1, wherein the magnetic field is applied to the conductive paste at a forty five degree angle relative to a substrate to which the conductive ink trace is applied.

* * * * *